INVENTORS
GEORGE R. MACNAMARA
JAKEN Y. HUIE
BY Kenneth I Grace
ATTORNEY

United States Patent Office 3,626,586
Patented Dec. 14, 1971

3,626,586
METHOD OF MANUFACTURING MULTIPLE EXTENDED TAB PRINTED CIRCUIT BOARDS

Jaken Y. Huie, Minneapolis, and George R. Macnamara, Burnsville, Minn., assignors to Sperry Rand Corporation, New York, N.Y.

Filed Apr. 23, 1970, Ser. No. 31,187
Int. Cl. H01f 7/06
U.S. Cl. 29—604 8 Claims

ABSTRACT OF THE DISCLOSURE

A method of simultaneously manufacturing a plurality of memory frames, each for the support of and electrical interconnection to a plurality of magnetizable memory cores. The method includes: fabricating two epoxy-glass-base double-copper-clad boards having desired copper patterns thereon; organically etching the epoxy-glass in selected areas unprotected by the copper patterns; forming registration holes and epoxy-glass frames about which the extended tabs are to be formed; solder plating all underside copper surfaces exposed by the etched epoxy-glass; removing the copper pattern from the mating surfaces of the boards; laminating together the boards on their epoxy-glass mating surfaces using the registration holes for tooling alignment; fabricating desired printed circuit and extended tab patterns on the outside (top and bottom) copper layers; separating the memory frames from each other and from the border strip; removing the solder plate from the underside of th extended tabs; and, tin coating the extended tabs and the printed circuit patterns.

BACKGROUND OF THE INVENTION

The present invention relates to the material treating art, and in particular, to methods of manufacturing memory frames for the support of and electrical interconnection to a plurality of magnetizable memory cores utilized in the memory section of an electronic data processing system. Such magnetizable memory cores, or ferrite toroids, are usually oriented in a core nest, see A. R. Hanson, et al., Pat. No. 3,421,865, and arranged in a plurality of orthogonally arranged rows and columns with a separate core at each row, column intersection. Drive lines are threaded through the central apertures of the toroidal cores along the rows and columns and terminate at suitable electrical conducting terminals, such as extended tabs, on the core-array supporting frame.

Such core-array supporting frames, or memory frames, have, in the past, been individually assembled in a series of material treating steps including well known printed circuit fabricating techniques. A method for manufacturing individual extended tab printed circuit boards is disclosed in the C. T. Crawford et al., Pat. No. 3,382,572. However, it is desirable, for the purpose of reducing the memory frame unit cost, that a method be provided whereby a plurality of memory frames may be simultaneously manufactured while providing the desired extended tab printed circuit connections. The present invention is directed toward such a method.

SUMMARY OF THE INVENTION

The present invention is directed toward a method of simultaneously manufacturing a plurality of memory frames. In the preferred method of the present invention two double-copper-clad epoxy-glass-base laminates are cut to similar, rough dimensions for proper handling. Copper patterns are formed in the copper layers of the two laminates with portions of the epoxy-glass base that are exposed by the removed copper organically etched, which organic etching may also form registration, or tooling, holes through the laminates, with the remaining epoxy-glass base of each laminate forming, when the two laminates are laminated together, one layer of the epoxy-glass memory frame. Underside surfaces of the copper layers that are exposed by the etched-away epoxy-glass are then covered with a solder plate with the remaining copper on the exposed surface removed whereby the copper layer is retained on only one surface of the epoxy-glass base. A suitable adhesive is affixed to the exposed surfaces of the epoxy-glass base from which the copper layer has been removed with the two laminates aligned by means of their registration holes and then laminated together to form a single laminate assembly. The desired printed circuit and extended tab patterns are then formed on the outside (top and bottom) copper layers of the laminate assembly. Individual memory frames are then separated from each other and from the border strip. The extended tabs of the memory frames are then cleaned and tin coated by immersion in a tin bath.

DESCRIPTION OF THE PREFERRED EMBODIMENT

Figure 1:
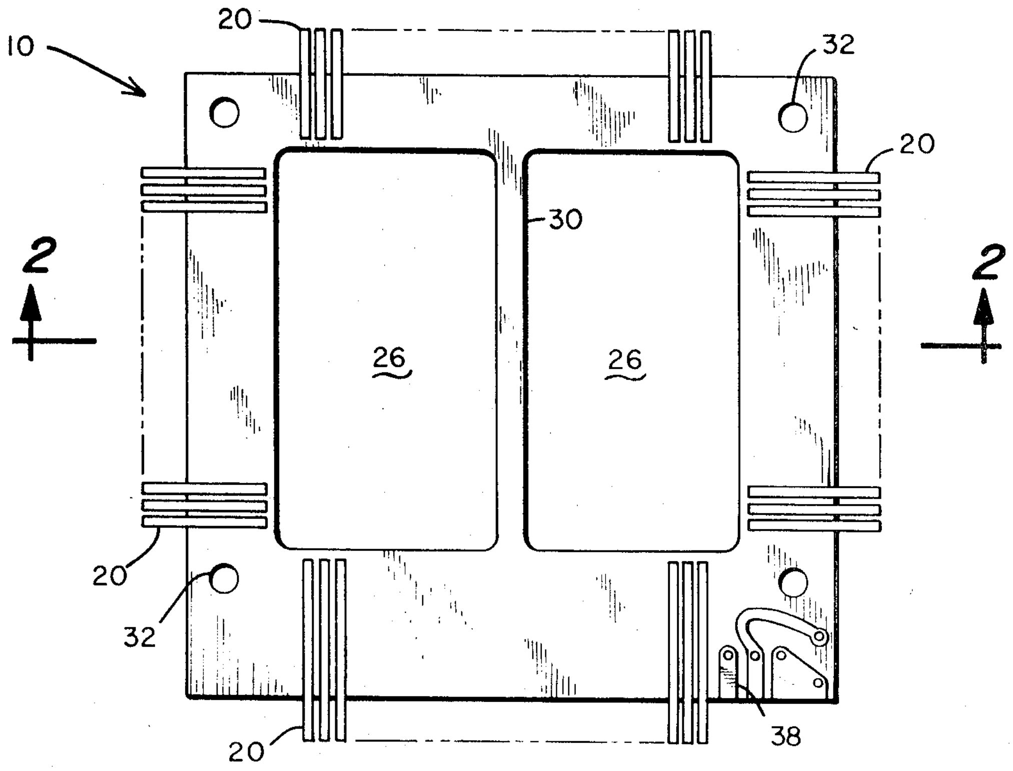
FIG. 1 is an illustration of a single memory frame, a plurality of which are simultaneously manufactured by the method of the present invention.

With particular reference to FIG. 1 there is illustrated a single memory frame 10 a plurality of which are simultaneously manufactured according to the method of the present invention. Memory frame 10 is comprised of two sheets 12, 16 of an epoxy-glass material having a plurality of copper extended-tabs 20, 22, respectively, formed thereon by conventional printed circuit techniques. Sheets 12, 16 are laminated together by the use of a suitable adhesive 24 for forming an integral assembly. Memory frame 10 has two "windows" 26 formed therethrough, separated by stiffening strip 30, and may include a plurality of non-plated-through alignment holes 32.

Figure 2:
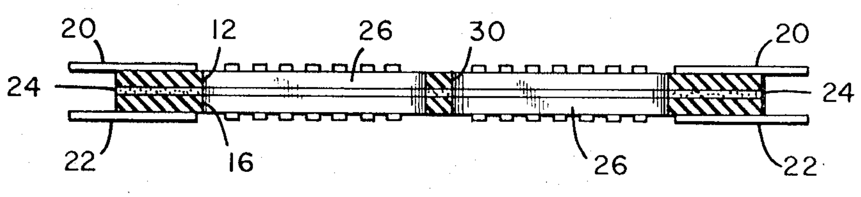
FIG. 2 is a cross-section of the memory frame of FIG. 1 taken along line 2—2 of FIG. 1.
Figure 5:
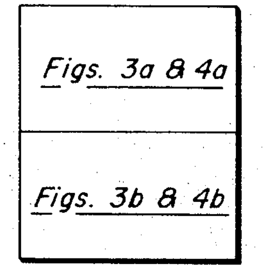
FIG. 5 is an illustration of the arrangement of FIGS. 3*a*, 3*b*, 4*a*, 4*b*.

With particular reference to FIG. 2 there is illustrated a cross-section of memory frame 10 of FIG. 1 taken along line 2—2 of FIG. 1. FIG. 2 is presented to illustrate the cross-section of the memory frame 10 fabricated in accordance with the method of the present invention in which a plurality of memory frames 10 are manufactured simultaneously.

Figure 4A:
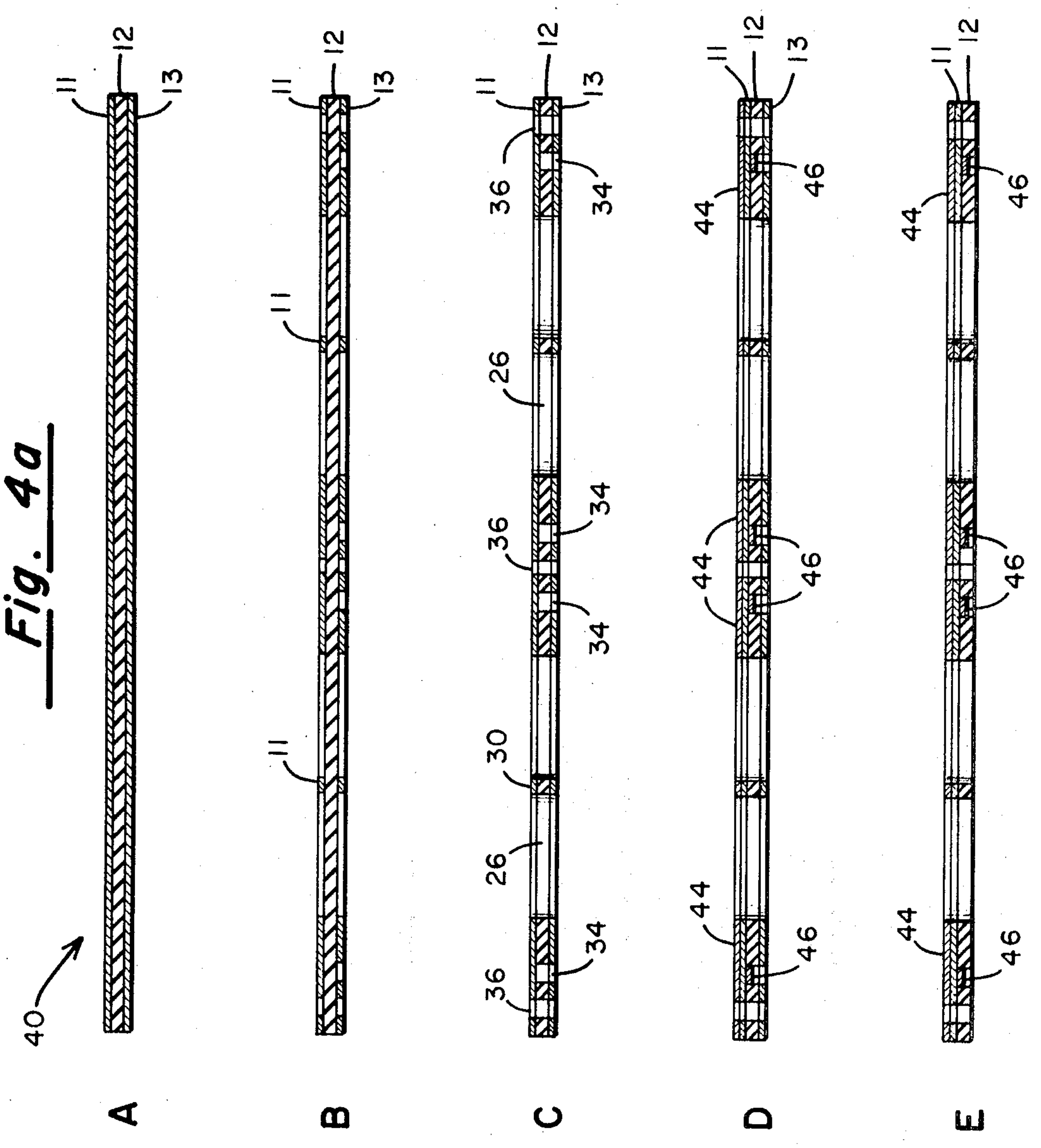
FIGS. 4*a*, 4*b* form a series of views illustrating a plurality of typical production memory frames which are under preparation in accordance with the technique of FIG. 3, the various figures illustrating the memory frames progressively in various stages of their production and corresponding to the steps that are indicated adjacently in the flow diagram of FIG. 3.
Figure 3A:
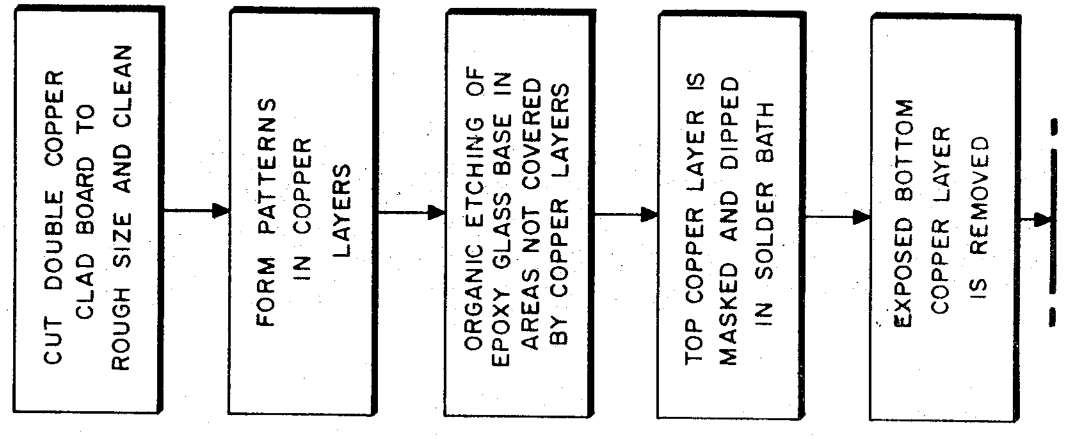
FIGS. 3*a*, 3*b* form a flow diagram illustrating a typical series of steps that may be followed in preparing a plurality of memory frames in accordance with the present invention.
Figure 4B:
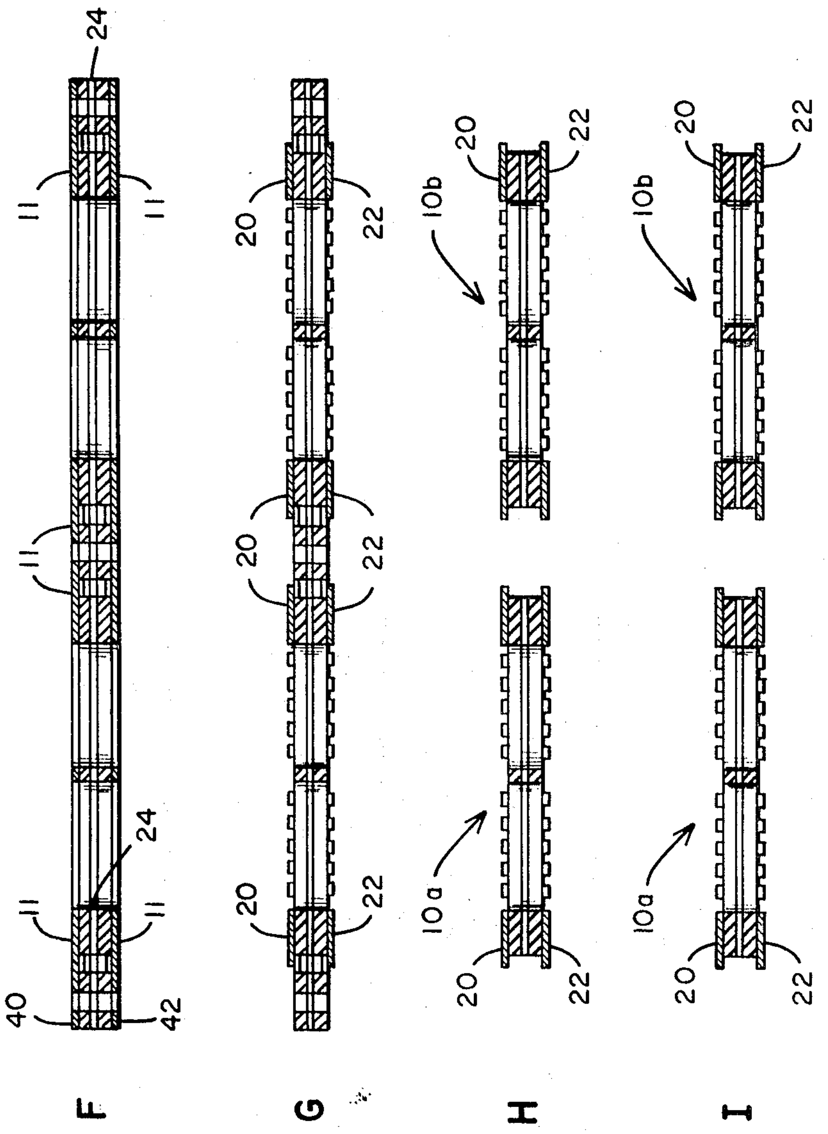
Figure 3B:
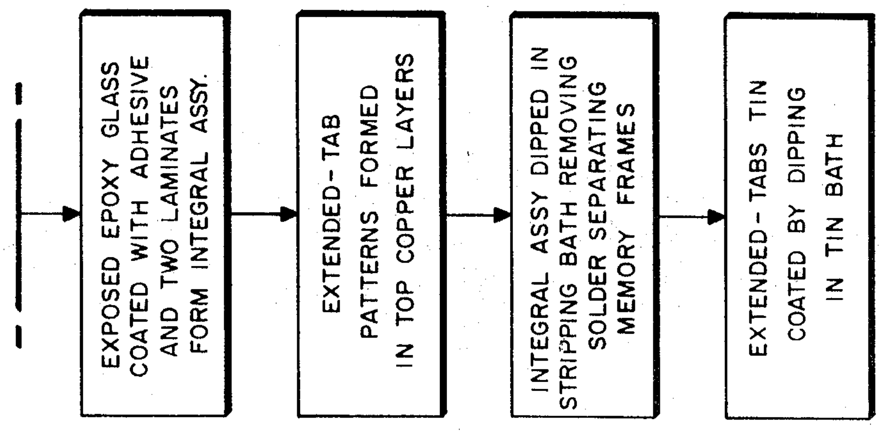

Discussion of an exemplary method of the simultaneous fabrication of a plurality of memory frames 10 as proposed by the present invention shall proceed with references to FIGS. 3*a*, 3*b*, 4*a*, 4*b*. FIGS. 3*a*, 3*b* illustrate a flow diagram of a series of steps which may be followed in preparing the memory frames in accordance with a preferred technique of the present invention. FIGS. 4*a*, 4*b* illustrate progressively the appearance of the product of the present invention during various stages of its fabrication. Each of the illustrations of FIGS. 4*a*, 4*b* is located in adjacent steps during which it is formed, as seen in the flow diagram of FIGS. 3*a*, 3*b*. In the method of the present invention as presently practiced by the inventors, 15 memory frames 10 are fabricated simultaneously in a 3 x 5 array in accordance with the flow diagram of FIGS. 3*a*, 3*b*. However, because of the size limitation of the patent drawings the illustrated method indicates an array of two memory frames 10 wide, it being understood that the method of the present invention is not limited thereto.

Step A.—As indicated by the flow diagram of FIGS. 3*a*, 3*b*, a preferred method of practicing the present invention commences with the forming, or shaping, to the desired dimensions of two double-copper-clad laminates 40, 42 each consisting, respectively, of an epoxy-glass base 12 of 0.009-inch thickness, a copper layer 11 of 4-ounce copper, and a copper layer 13 of 1-ounce copper. In the following discussion of applicants' preferred method two laminates 40 and 42 may be fabricated simultaneously with laminate 42 formed as a mirror-image of the thru-aperture pattern of laminate 40. Accordingly, for purposes of simplifying the discussion of applicants' preferred method only the noted operations on laminate 40 shall be discussed in detail, it being understood that like operations are performed upon laminate 42 whereupon laminate 42 is processed to become a mirror-image reproduction of the thru-aperture pattern of laminate 40 prior to the lamination of laminates 40, 42 in Step F below.

After shaping laminate 40 to the desired dimensions, laminate 40 is then cleaned by any suitable commercial solvent prior to the addition, on copper layers 11, 13, of the photo-resist in Step B below. In the procedure followed by the applicants, laminate 40 is scrubbed in a solution of circuit board cleaner, such as Fremont No. 328 manufactured by Fremont Industries, Inc., Minneapolis, Minn., which is placed upon copper layers 11, 13. With the aid of running tap water and a soft vegetable bristle brush copper layers 11, 13 are scrubbed until they show no water breaks. Laminate 40 is then thoroughly flushed with tap water followed by a quick flush with distilled water just prior to the application of the photo-resist in Step B below.

Step B.—After forming laminate 40 to the desired rough dimensions in Step A, Step B of the present method is initiated. Step B consists of forming, or fabricating, the desired (copper) frame patterns in both top and bottom copper layers 11 and 13. The patterns may be formed in accordance with methods well-known in the printed circuit art today. In the procedure followed by the applicants, a commercial, positive photo-resist solution, AZ-111, manufactured by the Shipley Co., Newton, Mass., is dip-coated on copper layers 11, 13. The photo-resist is air dried for a period of approximately 20 minutes and then oven baked for a period of approximately 15 minutes at a temperature of 150° F.

For the printing operation, photo-negatives having the predetermined arrangements of the desired patterns, which are prepared by any well-known means, are placed over copper layers 11, 13. The Colight printer used by applicants to develop the photo-resist is manufactured by Colight, Inc., Minneapolis, Minn., and requires a 6 minute printing time for applicants' procedure; however, such printing time is a function of many variables and must be determined empirically for each operation.

Next, in the development step for forming the predetermined printed circuit patterns in copper layers 11, 13, laminate 40 is dipped in a tank of AZ-303 developer, manufactured by the Shipley Co., for a period of two minutes, or until the image is clearly defined, after which it is rinsed with tap water. What remains are layers of "fixed" AZ-111 photo-resist having patterns defining the patterns desired to be established in copper layers 11, 13.

Next, in the etching step wherein the desired patterns are formed in the copper layers 11, 13, laminate 40 is installed in a suitable etching tank having the desired etching solution therein whereby the etchant is splashed against the exposed copper surfaces 11, 13 chemically machining away such exposed copper surfaces. In applicants' method, laminate 40 is installed on the conveyor of a Model 1000 Chem-Cut etcher, manufactured by the Chem-Cut Corp., State College, Pa., with the etchant solution being sprayed upon the exposed copper surfaces of copper layers 11, 13. In this etching step, applicants use an etchant solution of chromic-sulfuric such as Hunt's 826 manufactured by the Phillip A. Hunt Chemical Corp., Palisades Park, N.J. The developed photo-resist is then immersed in an acetone solution for a period of approximately 2 minutes or until all evidence of photo-resist is removed.

Step C.—After generation of the patterns of Step B above, the epoxy-glass base 12, in those areas from which the copper layers 11, 13 have been removed, is organically etched by a suitable etchant. Those areas in which the epoxy-glass base 12 is exposed on both sides are completely removed forming the windows 26 and the registration or tooling holes 36 while those areas of epoxy-glass base 12 exposed on one side only (the underside) are etched away leaving the portions of copper layer 11 in the areas 34 that will form the extended tabs of the finished memory frame 10. The organic etching of epoxy-glass base 12 consists of the following steps:

(1) Laminate 40 is placed in a concentrated sulpheric acid bath at room temperature for a sufficient period to etch the desired amount of the epoxy-glass base resin to expose the glass material, after which the laminate 40 if flushed with tap water.

(2) Laminate 40 is placed in a concentrated hydrofluoric acid bath at room temperature for a sufficient period of time to etch the exposed glass material, after which the laminate 40 is flushed with tap water.

(3) Steps (1) and (2) above are repeated for a sufficient number of repetitions to provide the desired aperture contours 26, 34, 36 in epoxy-glass base 12.

Step D.—After chemically etching away the desired areas of the epoxy-glass layer 12 of Step C, the exposed patterns of layer 11 are masked by any well-known mask means 44, such as using masking tape, except for the portion thereof that is to make electrical contact with the plating clamp. Only that portion of layer 13 that would otherwise make contact with the plating clamp is insulatively masked therefrom. The masked laminate 40 is then dipped into a solder plating bath whereupon the exposed undersides of the pattern of layer 11 in the areas 34 are solder plated 46 to form an etchant resist for the etching of Step E.

Step E.—After the solder plating of the undersides of the pattern of layer 11 in areas 34, which are to form the extended tab portions of the finished memory frame 10, the exposed pattern of layer 13 is then removed by a suitable etchant as in Step B above. After removal of mask means 44, the preliminary processing of laminate 40 (and laminate 42) is completed.

Step F.—After completion of Step E, laminate 40, and laminate 42, have their opposing, mating, surfaces of their epoxy-glass bases 12 coated with a suitable adhesive 24, such as EC2290 manufactured by Minnesota Mining and Manufacturing Co., St. Paul, Minn. Laminates 40, 42 are then placed into a machine press whose press plate registration pins extend through the registration, or tooling, holes 36 formed in Step C. Laminate 40, 42 is then cured in the machine press at one hour at 350° F. at 800 pounds per square inch (p.s.i.).

Step F'.—Because applicants have determined that the optimum thickness of the epoxy-glass base 12 for a desired organic etching of the apertures therethrough is of a maximum of 0.009 inch thickness the overall thickness of laminate 40, 42 formed in Step F above is limited by this maximum thickness of the epoxy-glass base members 12. In applications where laminate 40, 42 of a greater overall thickness is desired, Step F above may be modified by replacing the applied adhesive 24 by a sheet of No-Flo Pre-Preg, manufactured by Fortin Laminating Corp., Los Angeles, Calif., pre-punched and of the desired thickness. One or more sheets of Pre-Preg may be utilized to build up laminate assemblies of the desired overall thickness.

Step G.—After fabrication of the laminate 40, 42 the particular extended tab patterns 20, 22 and printed circuit pattern 38 are formed in the copper layers 11 by any of well-known methods such as in Step B above.

Step H.—After the generation of the desired extended tab patterns 20, 22 and printed pattern 38 in laminate 40, 42, laminate 40, 42 is placed into a solder stripping bath whereupon the solder coating 46 of Step D above is removed and the individual memory frames 10*a*, 10*b* are separated from each other and from the border strip along the extended tab patterns 20, 22.

Step I.—After separation of the individual memory frames 10*a*, 10*b*, the memory frames 10*a*, 10*b* are immersed in a tin bath for tin coating the extended tabs 20, 22 and printed circuit pattern 38.

Step J.—Lastly, any necessary non-plated-through holes 32 are drilled as required.

We claim:

1. A method of simultaneously manufacturing a plurality of memory frames, each for the support of and electrical interconnection to a plurality of magnetizable memory cores, the method comprising the steps of:
   (A) cutting to rough size a double-copper-clad epoxy-glass-base first board;
   (B) forming patterns in the top and bottom copper layers of said first board;
   (C) chemically etching away the portions of the epoxy-glass-base that are not covered by the patterns in the top and bottom copper layers of said first board;
   (D) forming thru-apertures that extend through said epoxy-glass-base;
   (E) chemically etching away the portions of the epoxy-glass-base that are not covered by the pattern in the bottom copper layer of said first board;
   (F) exposing the undersides of portions of the pattern in the top copper layer of said first board;
   (G) solder coating the exposed underside portions of the pattern in the top copper layer of said first board;
   (H) removing the bottom copper layer of said first board;
   (I) repeating steps A—H for forming a second board that is the substantial mirror-image of the thru-apertures of said first board;
   (J) superposedly aligning the thru-apertures of said first and second boards;
   (K) adhesively laminating the exposed epoxy-glass-base of said two boards for forming an integral assembly;
   (L) forming extended-tab patterns in said first and second boards' patterns in the solder coated underside;
   (M) removing the solder in the solder coated underside portions of said integral assembly;
   (N) separating the so-formed individual memory frames along the extended-tab patterns.

2. The method of claim 1 in which said step (K) includes laminating one or more layers having the substantial mirror-image of the thru-apertures of said first board between said first and second boards.

3. The method of claim 1 further including the step:
   (O) tin coating said extended tabs.

4. The method of claim 3 further including the step:
   (P) drilling non-plated through holes in said individual memory frames for assembly alignment.

5. A method of simultaneously manufacturing a plurality of memory frames, each for the support of and electrical interconnection to a plurality of magnetizable memory cores, the method comprising the steps of:
   (A) cutting to rough size a double-conductive-layer epoxy-glass-base first board;
   (B) forming patterns in the top and bottom conductive layers of said first board;
   (C) chemically etching away the portions of the epoxy-glass-base exposed by the patterns in the top and bottom conductive layers of said first board;
   (D) forming thru-apertures extending through said epoxy-glass-base;
   (E) exposing the underside of the pattern in the top conductive layer of said first board;
   (F) solder coating the exposed underside of the pattern in the top conductive layer of said first board;
   (G) removing the pattern in the bottom conductive layer of said first board;
   (H) repeating steps (A)–(G) forming a second board that is the substantial mirror-image of the thru-apertures of said first board;
   (I) adhesively laminating the exposed epoxy-glass-base of each of said two boards for forming an integral assembly;
   (J) forming extended tab patterns in said first and second boards' exposed patterns in the solder coated underside areas;
   (K) removing the solder in the solder coated underside areas;
   (L) separating the so-formed individual memory frames along the extended tab patterns.

6. The method of claim 5 in which said step (J) includes laminating one or more layers having the substantial mirror-image of the thru-apertures of said first board between said first and second boards.

7. The method of claim 6 further including the step:
   (O) tin coating said extended tabs.

8. The method of claim 6 further including the step:
   (O) drilling through holes in said individual memory frames for assembly alignment.

References Cited

UNITED STATES PATENTS

| | | | |
|---|---|---|---|
| 3,042,591 | 7/1962 | Cado | 29—604 X |
| 3,457,634 | 7/1969 | Root | 29—604 |

GRANVILLE Y. CUSTER, Jr., Primary Examiner